(12) United States Patent
Fujii

(10) Patent No.: US 7,126,270 B2
(45) Date of Patent: Oct. 24, 2006

(54) REFLECTOR FOR A LIGHT EMITTING DEVICE

(75) Inventor: Gen Fujii, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/877,468

(22) Filed: Jun. 25, 2004

(65) Prior Publication Data

US 2004/0263062 A1    Dec. 30, 2004

(30) Foreign Application Priority Data

Jun. 30, 2003    (JP) ............................ 2003-188853

(51) Int. Cl.
  *H01J 1/62*  (2006.01)
  *H01J 5/16*  (2006.01)
(52) U.S. Cl. ...................................... 313/505; 313/110
(58) Field of Classification Search ........ 313/504–509, 313/110, 113, 114, 117
See application file for complete search history.

(56) References Cited

U.S. PATENT DOCUMENTS

| 6,157,356 | A | 12/2000 | Troutman ..................... 345/82 |
| 6,320,311 | B1 * | 11/2001 | Nakaya et al. ............... 313/506 |
| 6,384,427 | B1 | 5/2002 | Yamazaki et al. ............. 257/59 |
| 6,417,521 | B1 | 7/2002 | Inukai ........................ 257/59 |
| 6,476,550 | B1 * | 11/2002 | Oda et al. .................... 313/504 |
| 6,630,684 | B1 * | 10/2003 | Lee et al. ..................... 257/40 |
| 6,787,976 | B1 * | 9/2004 | Minoura et al. ............. 313/110 |
| 6,815,886 | B1 * | 11/2004 | Kawase ....................... 313/506 |
| 6,828,725 | B1 * | 12/2004 | Kimura ....................... 313/505 |
| 6,829,023 | B1 | 12/2004 | Goto .......................... 349/113 |
| 2002/0050795 | A1 | 5/2002 | Imura ....................... 315/169.3 |
| 2002/0101152 | A1 | 8/2002 | Kimura ....................... 313/505 |
| 2004/0217702 | A1 * | 11/2004 | Garner et al. ............... 313/512 |

FOREIGN PATENT DOCUMENTS

| JP | 2002-132186 | 5/2002 |
| JP | 2002-229482 | 8/2002 |
| JP | 2002-352950 | 12/2002 |

OTHER PUBLICATIONS

Gu, G. et al, "High-External-Quantum-Efficiency Organic Light-Emitting Devices," Optics Letters, vol. 22, No. 6, pp. 396-398, Mar. 15, 1997.

* cited by examiner

*Primary Examiner*—Karabi Guharay
*Assistant Examiner*—Dalei Dong
(74) *Attorney, Agent, or Firm*—Cook, Alex, McFarron, Manzo, Cummings & Mehler, Ltd.

(57) ABSTRACT

A light-emitting device is disclosed with improved luminance even with increased arrangement density of a reflector regardless of a light-emitting region. The disclosed device includes a reflector between an electrode for extracting light from a layer including a luminescent material, which serves as a light-emitting region of a light-emitting element, and an exterior space (air). In addition, a light-extraction efficiency can be improved by setting an angle made by a surface of the reflector, which faces the light-emitting element, and a side surface of the reflector (hereinafter, referred to as a slope angle of the reflector) in a predetermined range as for a shape of the reflector.

16 Claims, 9 Drawing Sheets

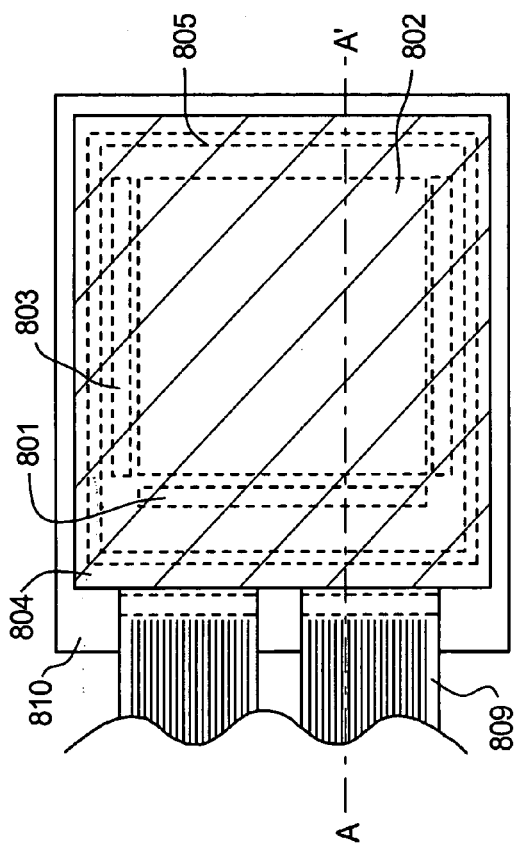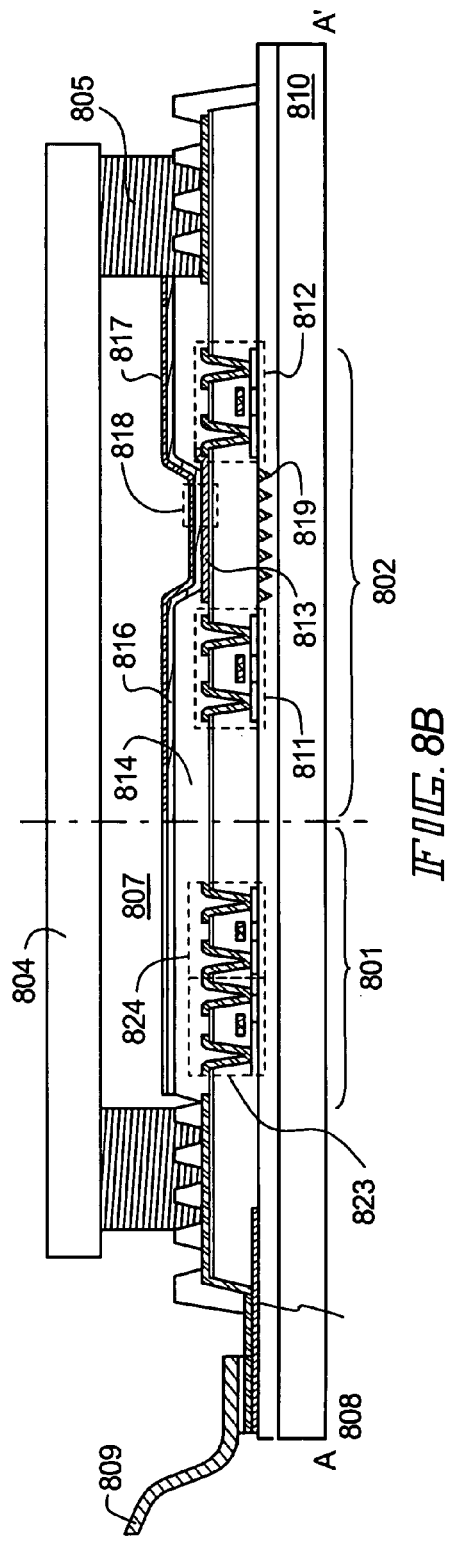

REFLECTOR FOR A LIGHT EMITTING DEVICE

BACKGROUND OF THE INVENTION

1. Field of the Invention

The present invention relates to improving a luminance of a light-emitting device that has a light-emitting element.

2. Description of the Related Art

A light-emitting element that is thin in thickness, light in weight, has a high speed response, and uses a low DC driving voltage has been expected to be applied to a next-generation flat panel display. In particular, a light-emitting device that has light-emitting elements arranged in a matrix shape is considered to be superior in having a wide view angle and a high level of visibility, as compared to a conventional liquid crystal display device.

A light-emitting element is said to have an emission mechanism wherein an electron and a hole respectively injected from a pair of electrodes are recombined in the luminescence center of a layer including luminescent material to form an excited molecule when a voltage is applied to the layer including the luminescent material between the pair of electrodes. Energy is released to emit light when the excited molecule moves back toward the ground state. Both a singlet excited state and a triplet excited state are known, and luminescence is said to be possible through either of them.

When light-emitting elements are arranged in a matrix, the driving method can be passive matrix driving (a simple matrix type) or active matrix driving (an active matrix type). When the pixel density is high, an active matrix type in which a switch is provided for each pixel (or each dot) is considered to be advantageous since low-voltage driving is possible.

One problem in such a light-emitting device is that light can be extracted insufficiently from the light-emitting element. One may provide a reflector for improving a light-extraction efficiency. It is reported, for example, that a wiring of a TFT is used as a light-reflector. For example, refer to Patent Document 1. It is also reported that a metal film is formed into a portion of a substrate in advance. For example, refer to Patent Documents 1 and 2.

(Patent Document 1)

Japanese published unexamined application No. 2002-229482

(Patent Document 2)

Japanese published unexamined application No. 2002-352950

However, in the foregoing cases, a structure that has the reflector arranged in a position overlapped with a light-emitting region of a light-emitting layer is used when extracting light from the side where the reflector is arranged. Therefore, when an arrangement density of the reflector is made higher, the luminance is not improved since the light-emitting region is narrowed, while the light-extraction efficiency (light intensity extracted outside/light intensity emitted from the light-emitting region) is improved. Alternatively, when the arrangement density of the reflector is made lower to expand the light-emitting region, the light-extraction efficiency is decreased since light emitted from the light-emitting region cannot be reflected by the reflector so much, with the result that luminance is not improved. The arrangement density of the reflector is a ratio of an area of the reflector provided in a position overlapped with a light-emitting surface of a light-emitting layer to an area of the light-emitting region of the light-emitting layer. This ratio may be considered as that of an area of the reflector provided in a position overlapped with a light-emitting surface of a light-emitting layer to an area of the light-emitting region of the light-emitting layer in a pixel.

SUMMARY OF THE INVENTION

It is an object of the present invention to provide a light-emitting device that is capable of improving luminance despite increasing an arrangement density of a reflector independently of a light-emitting region.

According to one aspect of the present invention, it is one of features to provide a reflector between an electrode for extracting light from a layer including a luminescent material, which serves as a light-emitting region of a light-emitting element, and an exterior space (air). According to another aspect of the present invention, the light-extraction efficiency can be improved by controlling an angle made by a surface of the reflector, which faces the light-emitting element, and a side surface of the reflector (hereinafter, referred to as a slope angle of the reflector) to be in a predetermined range. In the case of forming the reflector in a portion of an insulating film, the reflector and the insulating film share a common surface. Further, a light-extraction efficiency can be improved by setting the arrangement density thereof in a preferred range.

In addition, also by setting a shape parameter of the reflector such as a height of the reflector or a width of the reflector, or an arrangement parameter of the reflector such as an arrangement distance of the reflector or a distance between the reflector and a reflective electrode in a desired range, the light-extraction efficiency can be improved. One reflector may be formed continuously all over the pixel portion. Also, each pixel may have a reflector therein. Further, a plurality of reflectors may be formed in each pixel.

In other words, the present invention provides a light-emitting device that has a light-emitting element over a substrate, wherein the light-emitting element includes a first electrode, a layer including a luminescent material, and a second electrode. The first electrode is transparent, a reflector is provided between the substrate and the first electrode, and the reflector is provided in a position overlapping (at least partially) the first electrode.

In addition, in the light-emitting device, in the case where the reflector is formed in a portion of an insulating film formed over the substrate, and the reflector and the insulating film share a common surface, when the layer including the luminescent material has a refractive index $n_1$ and the insulating film has a refractive index $n_2$, the reflector has a slope angle $\phi$:

when $n_1 \geq n_2$, $$\phi = 45 + (1/2)\sin^{-1}(1/n_2) \pm 10(°); \text{ and}$$

when $n_1 < n_2$, $$\phi = 90 - (1/2)\{\sin^{-1}(n_1/n_2) - \sin^{-1}(1/n_2)\} \pm 10(°) \, (n_1 \text{ and } n_2 = 1 \text{ to } 3)$$

Further, the layer including the luminescent material has a refractive index $n_1$, the reflector has a reflectance $r_1$, and the second electrode has a reflectance $r_2$, the reflector has an arrangement density x:

$$x < \cos\{\sin^{-1}(1/n_1)\} / [1 - r_1 r_2[1 - \cos\{\sin^{-1}(1/n_1)\}]]$$
$$(n_1 = 1 \text{ to } 3 \text{ and } 0.5 < r_1, r_2 < 1.0).$$

BRIEF DESCRIPTION OF THE DRAWINGS

In the accompanying drawings:

FIGS. 8A and 8B are diagrams illustrating a light-emitting device; and

DETAILED DESCRIPTION OF THE INVENTION

EMBODIMENT MODE

Figure 1A:
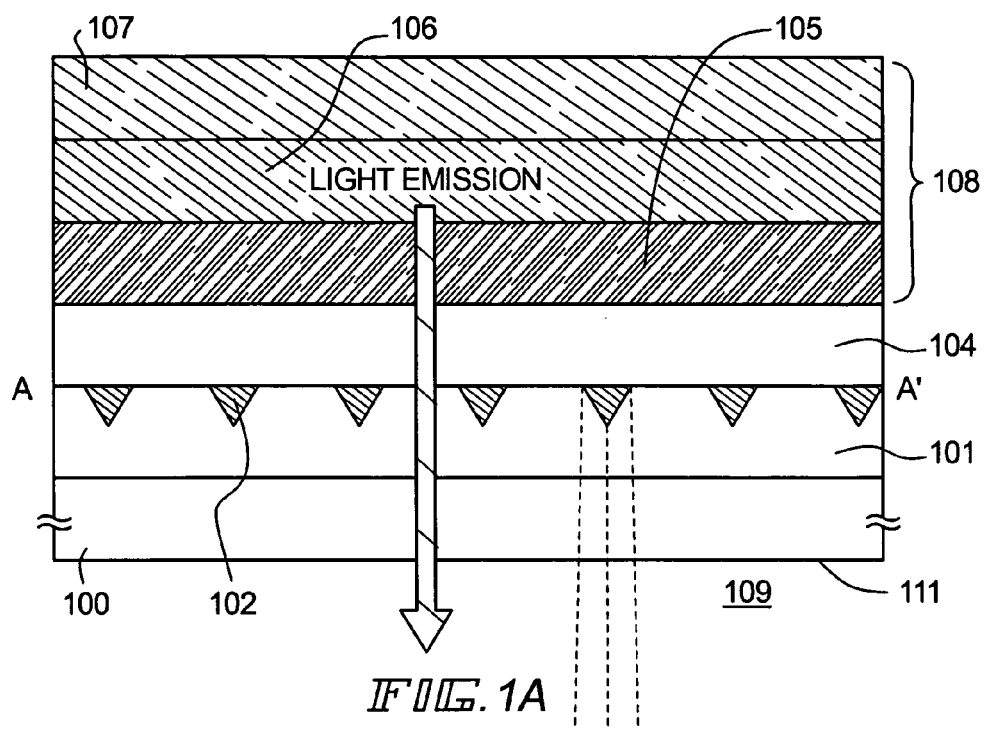
FIGS. 1A and 1B are diagrams illustrating an arrangement and a structure of a reflector according to certain aspects of the present invention.

Aspects of the present invention are described with reference to FIG. 1A. This shows a structure that has a reflector 102 in a portion of a first insulating film 101 formed over a substrate 100, where the substrate 100 can transmit light, and the reflector 102 is provided between an electrode (a transparent electrode 105) for extracting light from a light-emitting element 108 formed over a second insulating film 104 and an exterior space (air). The light-emitting element 108 includes the transparent electrode 105, a layer 106 including a luminescent material, and a reflective electrode 107.

Figure 1B:
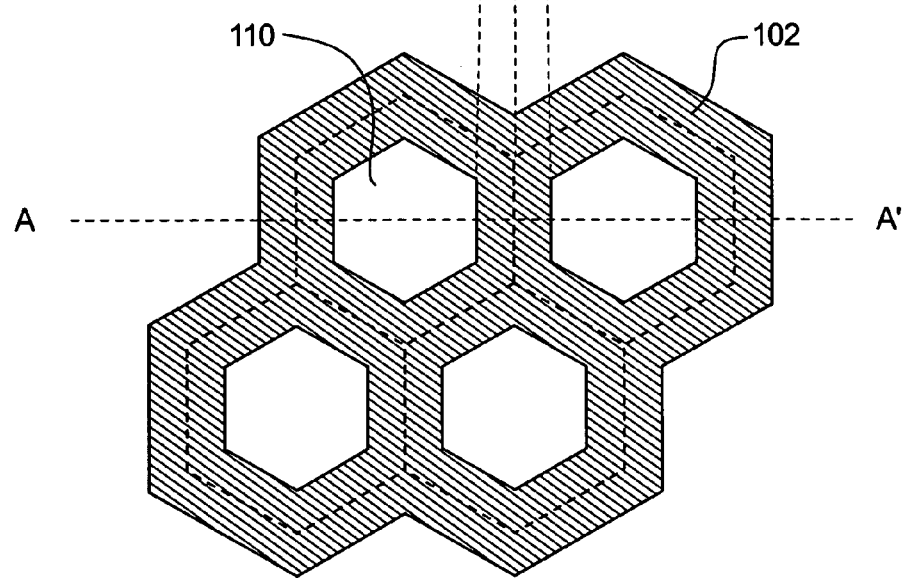

FIG. 1B shows a structure of the reflector 102 shown in FIG. 1A, which is viewed from the light-emitting element 108 side. Here, an example of the reflector 102 having a hexagonal opening 110 is shown. However, any shape, such as a quadrangle shape or a triangular shape, can be applied as long as the reflector of the same shape 102 can be formed repeatedly. It will be understood that the reflector 102 shares a common surface with the upper surface of insulating film 101 in FIG. 1A.

Next, a preferable shape of a reflector for improving an extraction efficiency of light obtained from a light-emitting element will be considered.

First, a preferable slope angle of a reflector will be considered. When light is emitted from a layer including a luminescent material (refractive index: $n_1$) at an angle (angle of emergence: $\theta_1$), the light is made to enter an insulating film (refractive index: $n_2$) at an angle (angle of incidence: $\theta_i$).

In this case, $$n_1 \sin \theta_1 = n_2 \sin \theta_i$$

is effected in accordance with Snell's law.

Since light is emitted in all directions from the layer including the luminescent material, $$-90° \leq \theta_1 \leq 90°.$$

Therefore, when $n_1 \geq n_2$, $$-90° \leq \theta_i \leq 90°, \text{ and}$$

when $n_1 < n_2$, $$-\sin^{-1}\left(\frac{n_1}{n_2}\right) \leq \theta_i \leq \sin^{-1}\left(\frac{n_1}{n_2}\right) \tag{1}$$

On the other hand, when the light that has entered the insulating film (refractive index: $n_2$) is reflected by the reflector and emitted at an angle (angle of emergence: $\theta_r$), the light enters the air (refractive index: 1) at an angle (angle of incidence: $\theta_a$).

In this case also, $$n_2 \sin \theta_r = \sin \theta_a$$

is effected in accordance with Snell's law.

When the light is emitted into the air, $\theta_r$ has a range of $$-\sin^{-1}\left(\frac{1}{n_2}\right) \leq \theta_r \leq \sin^{-1}\left(\frac{1}{n_2}\right) \tag{2}$$

Further, from the relationship between a slope angle ($\phi$) of the reflector and the angle ($\theta_r$) of the light reflected by the reflector ($\phi' = 90° - \phi$), $$\theta_i - \phi' = \phi' - \theta_r$$

Accordingly, $$\theta_r = 2\phi' - \theta_i \tag{3}$$

is effected.

So that the light that has entered the insulating film should be reflected by the reflector and extracted into air, it is necessary to satisfy $$-\sin^{-1}(1/n_2) \leq \theta_r \leq \sin^{-1}(1/n_2)$$

Accordingly, $$-\sin^{-1}(1/n_2) \leq 2\phi' - \theta_i \leq \sin^{-1}(1/n_2)$$

Consequently, $$2\phi' - \sin^{-1}\left(\frac{1}{n_2}\right) \leq \theta_i \leq 2\phi' + \sin^{-1}\left(\frac{1}{n_2}\right) \tag{4}$$

from Formula 2 and Formula 3.

In addition, the condition for the light with $\theta_i$ on a reflective surface of the reflector is expressed by $$\phi' < \theta_i \leq \theta_{i\,max} \tag{5}$$

In Formula 5,
when $n_1 \geq n_2$, $$\theta_{i\,max} = 90°, \text{ and}$$

when $n_1 < n_2$, $$\theta_{i\,max} = \sin^{-1}(n_1/n_2)$$

Here, since $\theta_i$ that satisfies Formula 5 also satisfies Formula 4, $$2\phi' - \sin^{-1}\left(\frac{1}{n_2}\right) \le \phi' \quad (6)$$

$$\theta_{i\max} \le 2\phi' + \sin^{-1}\left(\frac{1}{n_2}\right) \quad (7)$$

From Formula 6 and Formula 7, $$\frac{1}{2}\left[\theta_{i\max} - \sin^{-1}\left(\frac{1}{n_2}\right)\right] \le \phi' \le \sin^{-1}\left(\frac{1}{n_2}\right) \quad (8)$$

is effected, and from $\phi'=90°-\phi$, $$90 - \sin^{-1}\left(\frac{1}{n_2}\right) \le \phi \le 90 - \frac{1}{2}\left[\theta_{i\max} - \sin^{-1}\left(\frac{1}{n_2}\right)\right] \quad (9)$$

can be obtained.

As the slope angle $\phi$ is larger, an arrangement density of the reflector can be lowered, and a light-extraction efficiency can be increased. Therefore, the slope angle $\phi$ of the reflector in the present invention is expressed by $$\phi = 90 - \frac{1}{2}\left[\theta_{i\max} - \sin^{-1}\left(\frac{1}{n_2}\right)\right] \quad (10)$$

In Formula 10,
when $n_1 \ge n_2$, $\phi=45+(1/2)\sin^{-1}(1/n_2)(°)$, and when $n_1 < n_2$, $\phi=90-(1/2)\{\sin^{-1}(n_1/n_2)-\sin^{-1}(1/n_2)\}(°)$ In addition, in Formula 10, it is preferable that $n_1$ and $n_2=1$ to 3.

In other words, a preferable slope angle ($\phi$) of a reflector in the present invention is expressed by Formula 10.

Hence, according to one aspect of the present invention, a light-emitting device that is capable of improving an extraction efficiency of light from a light-emitting element can be formed by providing a reflector between the light-emitting element and an exterior space, and further setting a slope angle of the reflector in the range shown by Formula 10.

Further, in accordance with the present invention, an arrangement density of the reflector will be considered. When the arrangement density is set at x ($0<x<1$), a portion $(1-x)$ of light having entered a surface in which the reflector is formed is transmitted through a region in which no reflector is arranged to enter an interface between a substrate and the air. On the other hand, the other portion x of the light is reflected repeatedly between a flat surface of the reflector and a reflective electrode and then is transmitted through the region in which no reflector is located to enter the interface 111 between the substrate and the air.

By being reflected by the reflector and the reflective electrode, the light has an intensity attenuated $r_1$ times (where $r_1$ is a reflectance of the reflector, and where $0<r_1 \le 1$) and $r_2$ times ($r_2$ is a reflectance of the reflective electrode, $0<r_2 \le 1$), respectively. In addition, since light is emitted from a light-emitting layer isotropically in all directions, one half of the light is emitted toward the reflector and the other half is emitted toward the reflective electrode.

Consequently, a proportion T of light emitted from a light-emitting layer, which is transmitted through the region in which no reflector is arranged to enter the interface between the substrate and the air, is expressed by:

$$T = \frac{1}{2}\sum_{i=0}^{\infty}(1-x)(xr_1r_2)^i + \frac{1}{2}r_2\sum_{i=0}^{\infty}(1-x)(xr_1r_2)^i \quad (11)$$

$$T = \frac{(1+r_2)(1-x)}{2\cdot(1-r_1r_2x)} \quad (12)$$

Even when the light transmitted through the region in which no reflector is arranged is all extracted into air, the extraction efficiency can take only a value given by Formula 12 at a maximum.

On the other hand, an extraction efficiency $T_0$ in the case of arranging no reflector is expressed by:

$$T_0 = \frac{1}{2}(1+r_2)\left[1 - \cos\left(\sin^{-1}\left(\frac{1}{n_1}\right)\right)\right] \quad (13)$$

In order to improve an extraction efficiency by using a reflector, from Formula 12 and Formula 13, $(1+r_2)(1-x)/\{2(1-r_1r_2x)\} > (1+r_2)[1-\cos\{\sin^{-1}(1/n_1)\}]/2$ Consequently, $$x < \frac{\cos\left(\sin^{-1}\left(\frac{1}{n_1}\right)\right)}{1 - r_1r_2\left[1 - \cos\left(\sin^{-1}\left(\frac{1}{n_1}\right)\right)\right]} \quad (14)$$

In addition, it is preferable that $n_1=1$ to 3, and $0.5<r_1$, $r_2<1.0$ in the aforementioned Formula 13.

That is, a preferable arrangement density (x) of a reflector according to this aspect of the present invention is expressed by Formula 14.

In other words, it is preferable to provide a reflector between a light-emitting element and an exterior space, and further set an arrangement density of the a reflector in the range shown by Formula 14 in order to improve an extraction efficiency of light from the light-emitting element.

For example, when $n_1=1.5$ and $r_1=r_2=0.92$, it is preferable to set an arrangement density $x<0.95$.

Hereinafter, embodiments of the present invention will be described.

EMBODIMENT 1

In the present embodiment, a simulation of preferable shape and arrangement of a reflector for improving an extraction efficiency of light obtained from a light-emitting element will be described.

Figure 2A:
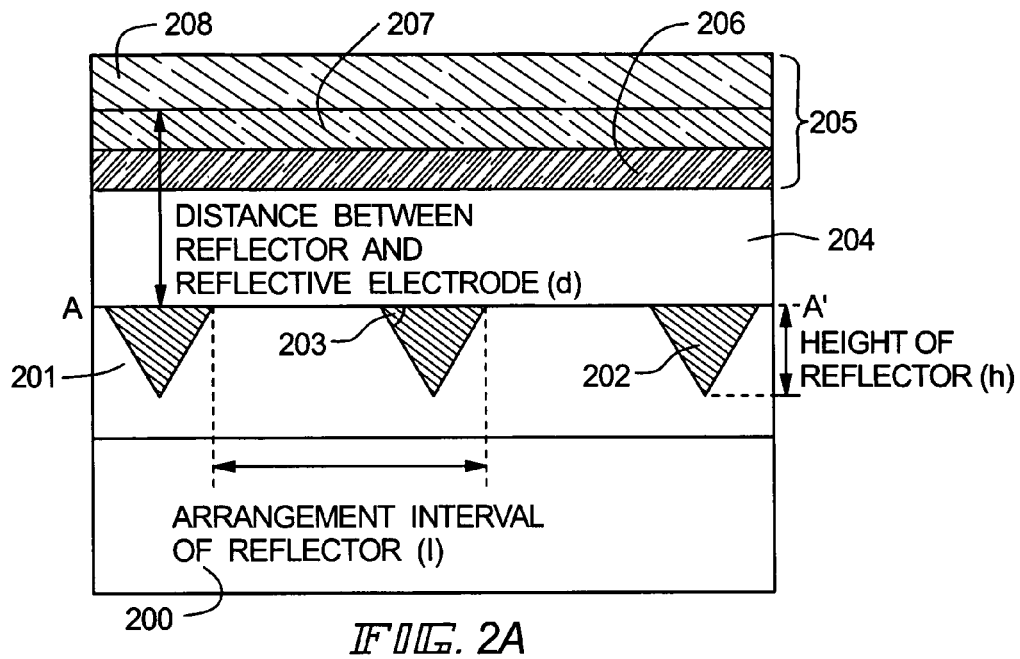
FIGS. 2A and 2B are diagrams showing a result of a simulation of a reflector.

As a model structure of a light-emitting device to be used for the simulation. FIG. 2A shows or represents a first insulating film 202, having a refractive index of 1.5, a reflector 203 having a reflectance of 92%, a second insulating film 204 having a refractive index of 1.5, and a light-emitting element 205 laminated over a glass substrate 201 having a refractive index of 1.5. The light-emitting element 205 includes a first electrode 206, a light-emitting layer 207 having a refractive index of 1.5, and a second electrode 208. When the second electrode 208 serves as a reflective electrode, its reflectance is preferably arranged to be 92%.

For the simulation, a ray tracing simulator such as Light • Tools from Optical Research Associate is used to trace light (illustratively, 5000 rays) emitted from random positions in the light-emitting layer of the light-emitting element isotropically in all directions by means of a detector disposed outside the glass substrate. In this case, only a total reflection is considered while a reflection at an interface between layers that have different refractive indexes from each other (the glass substrate/air) is ignored.

Figure 2B:
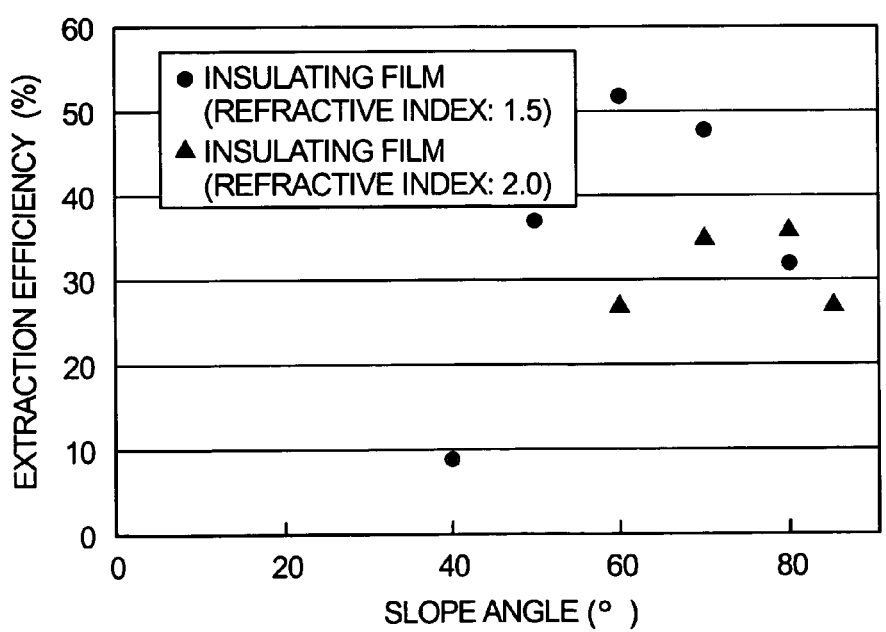

First, a simulation of a slope angle of the reflector was conducted. Here, a height (h) of the reflector, an arrangement interval (I) of the reflector, and a distance (d) between the reflector and the reflective electrode are set 1 μm, 3 μm, and 2 μm, respectively, and changes in extraction efficiency are measured for various slope angles of the reflector. FIG. 2B shows the results in one case where the first insulating film has a refractive index of 1.5 and in a second case where the first insulating film has a refractive index of 2.0.

According to the results of FIG. 2B, in the case of the refractive index of 1.5, the maximum extraction efficiency (52%) is obtained when the slope angle of the reflector is set at 60°. On the other hand, in the case of the refractive index of 2.0, the maximum extraction efficiency (36%) is obtained when the slope angle of the reflector is set at 80°. The extraction efficiency in the case where there is no reflector is 25%. Therefore, when the extraction efficiency is 25% or more in the present invention, this improvement can be attributed to the reflector. In other words, it is preferable that the slope angle of the reflector be set from 40° to 80° when the first insulating film 202 has a refractive index of 1.5 and the slope angle be set from 60° to 85° when the first insulating film 202 has a refractive index of 2.0.

Accordingly, it is preferable that a reflector in the present invention has a slope angle (φ) in the following range, that is, (the range shown by Formula 10 in Embodiment Mode) ±10°.

In other words, when a layer including a luminescent material has a refractive index $n_1$ and an insulating film has a refractive index $n_2$, it is preferable that:

when $n_1 \geq n_2$, $\phi = 45 + (1/2)\sin^{-1}(1/n_2) \pm 10(°)$; and when $n_1 < n_2$, $\phi = 90 - (1/2)\{\sin^{-1}(n_1/n_2) - \sin^{-1}(1/n_2)\} \pm 10(°)$ ($n_1$ and $n_2 = 1$ to 3).

EMBODIMENT 2

Next, a simulation of a relationship between a width (w) of a reflector and a distance (d) between the reflector and a reflective electrode was conducted in order to obtain a preferable range for improving the extraction efficiency. The measurement was conducted in the same way as Embodiment 1.

Figure 3A:
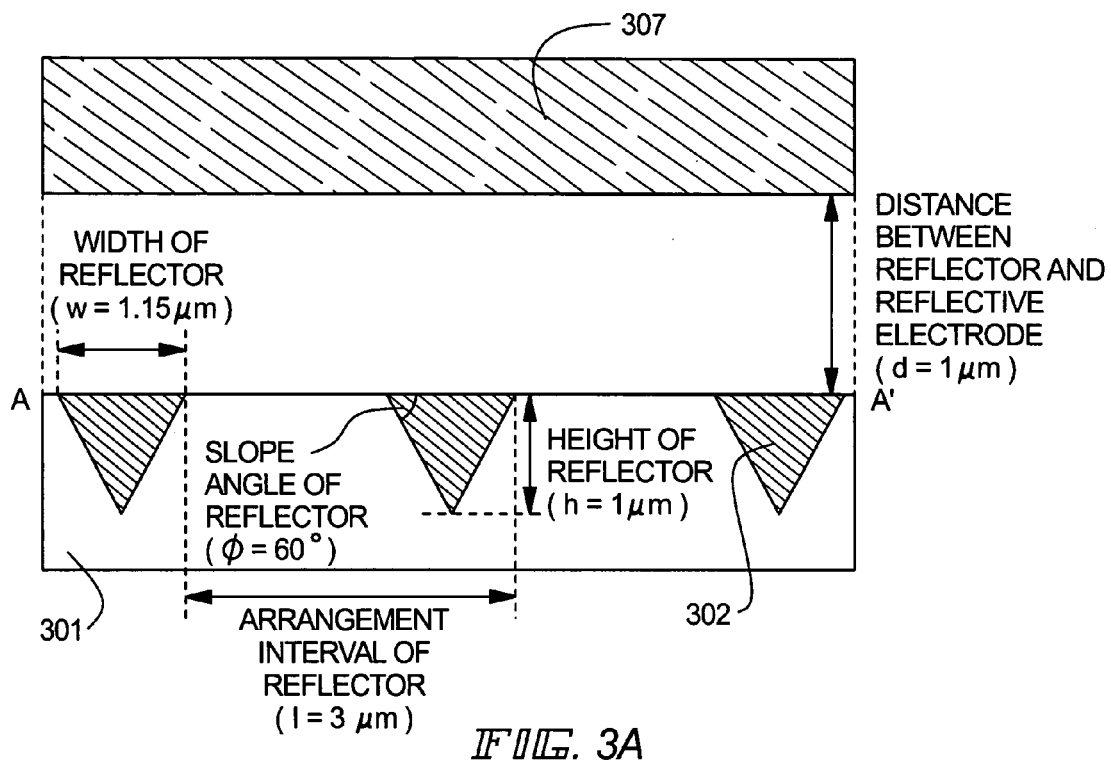
FIGS. 3A and 3B are diagrams showing a result of a simulation of a reflector.
Figure 3B:
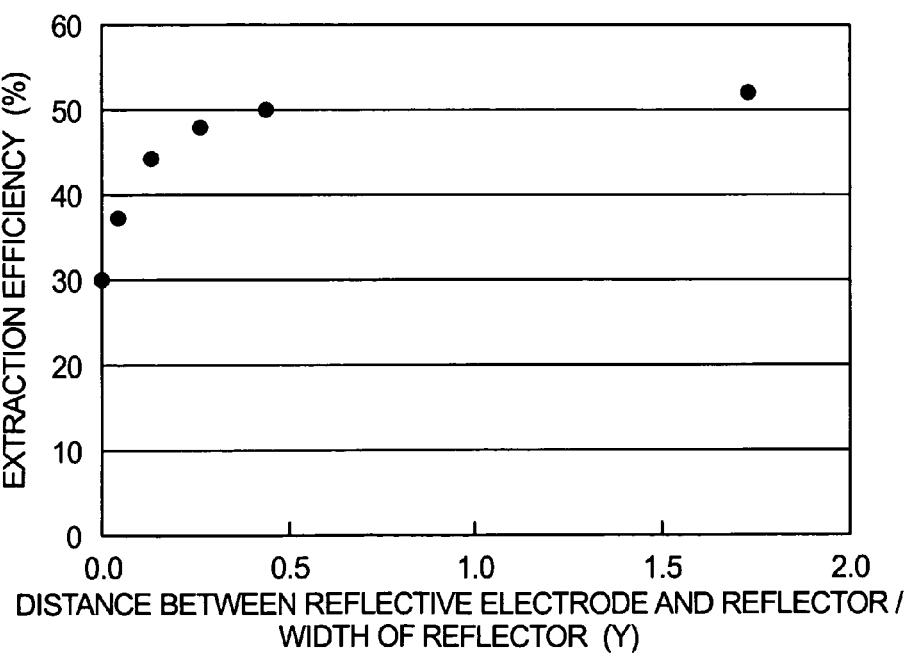

Here, a height (h) of the reflector, an arrangement interval (I) of the reflector, and a width (w) of the reflector are set 1 μm, 3 μm, and 1.15 μm, respectively, as shown in FIG. 3A, and changes in extraction efficiency are measured for various ratios (Y) of the distance between the reflector and the reflective electrode to the width of the reflector (=the distance between the reflector and the reflective electrode (d)/the width of the reflector (w)). In FIG. 3A, reference numerals 301, 302, and 307 denote a first insulating film, the reflector, and the reflective electrode, respectively. FIG. 3B shows the results where the first insulating film has a refractive index of 1.5.

According to FIG. 3B, the extraction efficiency is always 25% or more, indicating that an effect due to providing the reflector has been obtained. In the present embodiment, the extraction efficiency is 40% or more is regarded as more preferable. In other words, it is preferable that the ratio (Y) of the distance between the reflector and the reflective electrode to the width of the reflector be controlled to be 0.1 or more. The reason for this is that with the aforementioned conditions (the height (h) of the reflector is 1 μm, the arrangement interval (I) of the reflector is 3 μm, and the width (w) of the reflector is 1.15 μm), the extraction efficiency is 40% or more when the ratio (Y) of the distance between the reflector and the reflective electrode to the width of the reflector is controlled to be 0.1.

EMBODIMENT 3

Figure 4A:
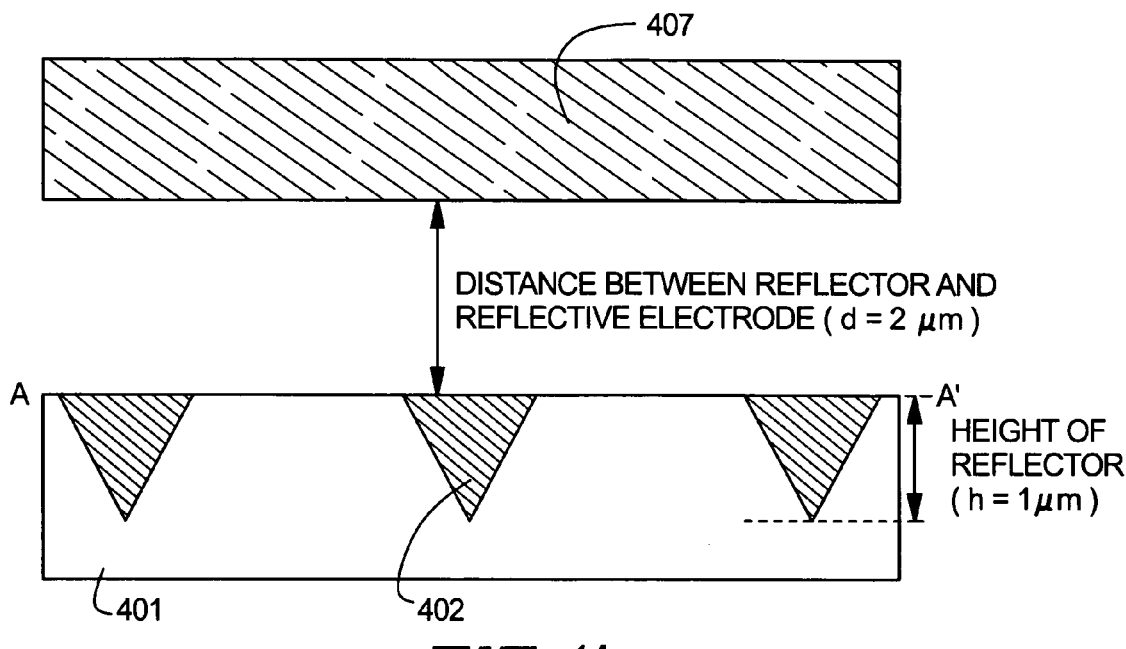
FIGS. 4A and 4B are diagrams showing a result of a simulation of a reflector.

Next, a simulation of an arrangement density (x) of a reflector is conducted in order to obtain a preferable range for improving extraction efficiency. Here, the height (h) of the reflector, and the distance (d) between the reflector and a reflective electrode are controlled to be 1 μm and 2 μm, respectively, as shown in FIG. 4A, and changes in extraction efficiency are measured for various arrangement densities (x) of the reflector. The arrangement density (x) of the reflector means a ratio of an area of the reflector provided in a position overlapping a light-emitting surface of a light-emitting layer to an area of the light-emitting surface of the light-emitting layer. In FIG. 4A, reference numerals 401, 402, and 407 denote a first insulating film, the reflector, and the reflective electrode.

Figure 4B:
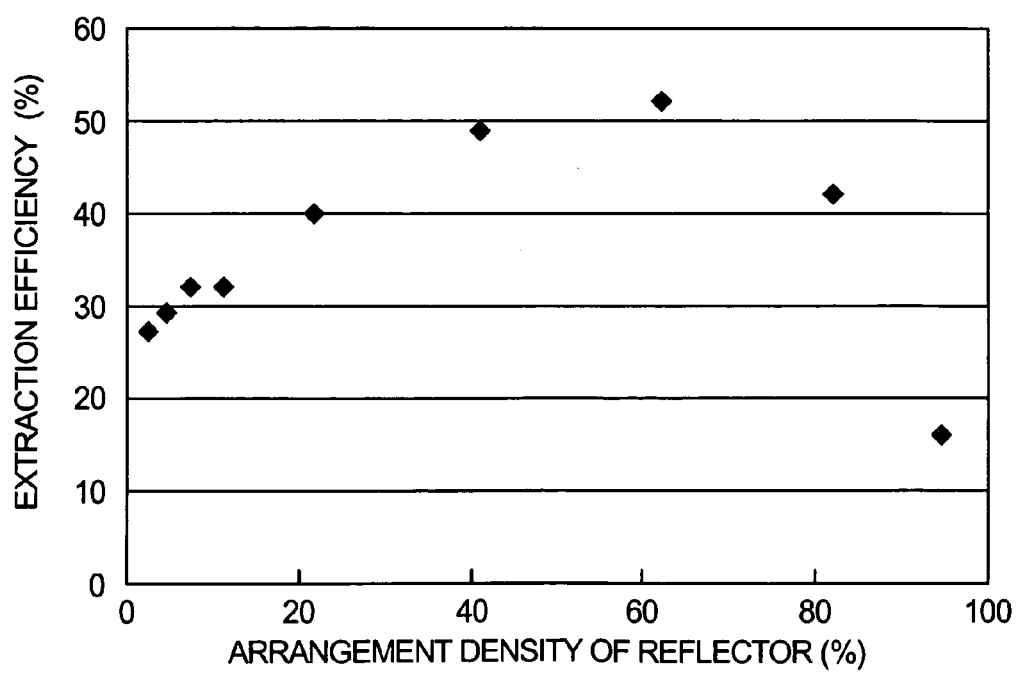

According to the result of FIG. 4B, the extraction efficiency is 25% or more when the arrangement density (x) of the reflector is set at 0.95 or less (95% or less in FIG. 4B shown in percentage). In the present invention, the effect of providing this is beneficial when the extraction efficiency is 25% or more. Therefore, the arrangement density of the reflector should be controlled to be 0.95 or less, more preferably, from 20 to 80%, in the aforementioned condition (the height (h) of the reflector is 1 μm and the distance (d) between the reflector and a reflective electrode is 2 μm).

EMBODIMENT 4

Figure 5A:
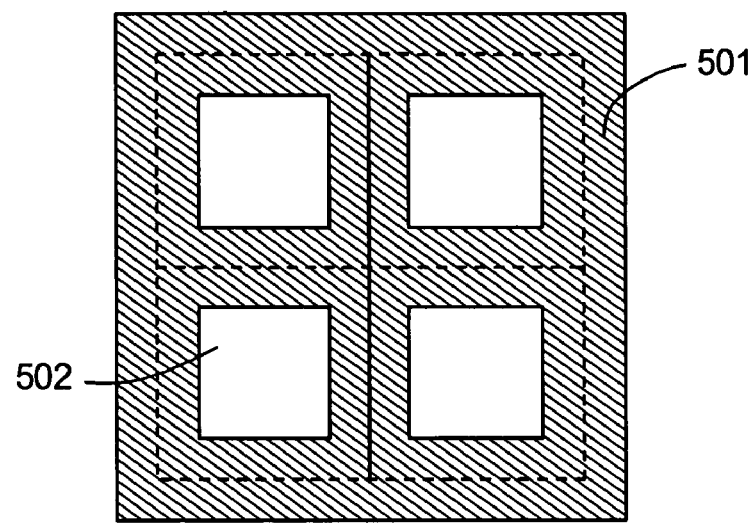
FIGS. 5A and 5B are diagrams illustrating shapes of a reflector.
Figure 5B:
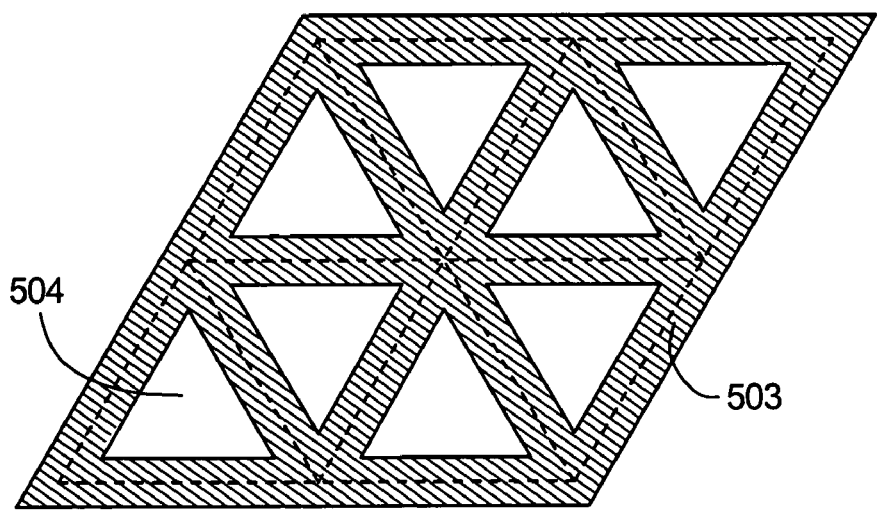

The present invention does not require the opening of the reflector to be hexagonal. FIGS. 5A and 5B show some cases where the opening has different shapes from the hexagonal shape shown in FIG. 1B.

FIG. 5A shows a reflector 501 that has openings 502 in the shape of a quadrangle. This shape makes it possible to form the reflector in a desired position without any gap, and therefore can be used for a reflector according to the present invention.

In addition, FIG. 5B shows a reflector 503 that has openings 504 in a triangular shape. Since the reflector can be formed in a desired position without any gap also in the case of this shape, this shape can be used for a reflector according to the present invention.

The reflector in the shape shown in the present embodiment can be arranged over an insulating film (the first insulating film 101 in FIG. 1A) formed over a substrate in the same way as the reflector shown in the first-described "Embodiment Mode".

EMBODIMENT 5

The influence on extraction efficiency of light from a light-emitting element due to the presence or absence of an arrangement of a reflector will be described.

In the present embodiment, the same structure shown in FIG. 1A is used. The first insulating film 101 and the second insulating film each have a refractive index of 1.5. The reflective electrode 107 and the reflector 102 each have a reflectance of 92% and an absorbance of 8%. The arrangement of the reflector is as shown in FIG. 1B.

Figure 6:
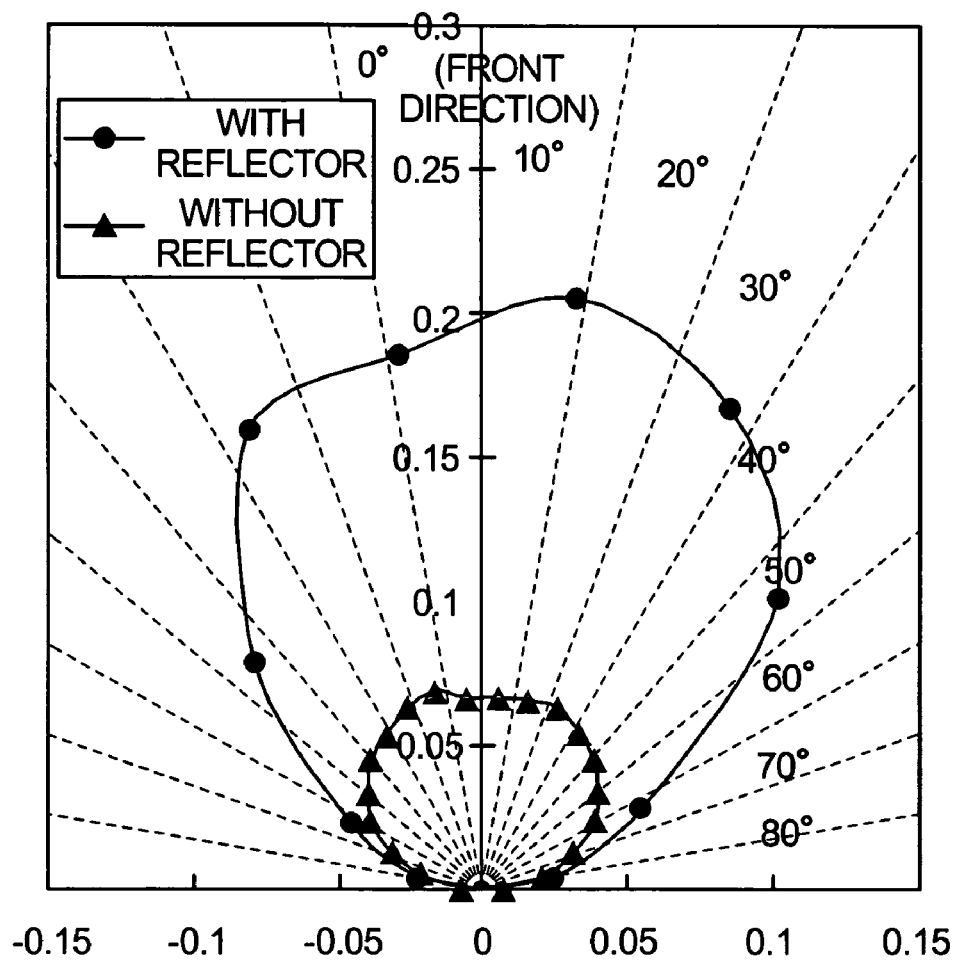
FIG. 6 is a diagram showing results of a simulation with a reflector and a simulation without a reflector.

FIG. 6 shows the distributions of light emission for the arrangement both with and without a reflector. This figure shows clearly that there is a difference in the distribution of light emission depending on a presence or absence of the reflector. Specifically, by providing the reflector, the light intensity in the direction of the front side is increased approximately threefold as compared to the case without the reflector provided.

In addition, the light-extraction efficiency is 25% without the reflector provided. However, by providing the reflector, the light-extraction efficiency becomes 51%, which is approximately double.

Hence, the light-extraction efficiency is spectacularly improved by providing the reflector.

EMBODIMENT 6

In the present embodiment, an active matrix light-emitting device will be described.

Figure 7A:
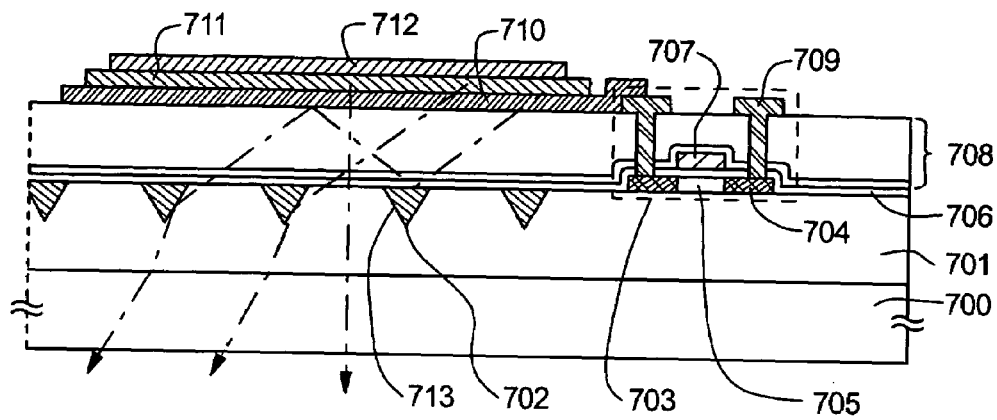
FIGS. 7A and 7B are diagrams illustrating an active matrix light-emitting device.

With reference to FIG. 7A, a case of forming a reflector according to the present invention before forming a TFT (thin film transistor) electrically connected to a light-emitting element will be described.

First, a first insulating film 701 is formed on a substrate 700. As a material for forming the first insulating film 701, an insulating film including silicon such as silicon oxide, silicon nitride, or silicon oxynitride can be used.

Next, photolithography is used to form a groove 713, thereby forming a portion surrounded by the groove in a portion of the first insulating film 701 in order to form a reflector. Then, a film containing a reflective material is formed over the first insulating film 701 including the opening. It is preferable that the reflective material that is used here has a reflectance of 50% or more in a visible light range, and more preferably, a material that has a reflectance of 80% or more is used. Specifically, a material such as silver (Ag), aluminum (Al), tantalum (Ta), niobium (Nb), molybdenum (Mo), copper (Cu), magnesium (Mg), nickel (Ni), or lead (Pb) is used.

After forming the reflective film, CMP (Chemical Mechanical Polishing) is used to polish the film comprising the reflective material until exposing a surface of the first insulating film 701, and thereby, a reflector 702 is formed.

Next, a TFT 703 is formed. The TFT has at least an impurity region (a source region or a drain region) 704, a channel-forming region 705, a gate insulating film 706, and a gate electrode 707.

Although a plurality of TFTs are formed in the same layer, the TFT 703 shown in FIG. 7A indicates a TFT electrically connected to a first electrode of a light-emitting element to be formed later (also referred to as a current controlling TFT). Then, an interlayer insulating film 708 is formed to cover the TFT 703. Such film 708 can be formed (here) of a single layer using an insulating material, or alternatively, a laminated structure using a plurality of insulating materials can be used. The insulating material may comprise a material such as an inorganic material (such as silicon oxide, silicon nitride, or silicon oxynitride) or a photosensitive or non-photosensitive organic material (such as polyimide, acrylic, polyamide, polyimideamide, resist, benzocyclobutene, or SOG). In the present embodiment, the interlayer insulating film 708 is formed of a laminated structure of a first layer of a silicon nitride film formed to have a film thickness of 100 nm and a second layer of acrylic formed to have a film thickness of 1.00 μm.

Next, after forming an opening in a portion of the interlayer insulating film 708 and the gate insulating film 706 to reach the impurity region 704 of the TFT 703, a wiring 709 is formed by depositing and patterning a conductive film. The wiring material may comprise an element selected from Ta, W, Ti, Mo, Al, and Cu, or one of an alloy material and a compound material including the element as its main component. In the present embodiment, a film of formed by sequentially laminating a tantalum nitride film with the film thickness of 30 nm and a tungsten film with the film thickness of 370 nm is used.

Next, a first electrode 710 electrically connected to the wiring 709 is formed. In the present embodiment, a transparent conductive film is used to form the first electrode 710. Since the first electrode 710 is an electrode that functions as an anode, ITO (indium tin oxide) is used to form the first electrode 710 by sputtering to achieve a film thickness of 110 nm.

Next, a layer 711 including a luminescent material is formed over the first electrode 710. Layer 711 may comprise a single-layer structure of only a light-emitting layer, or alternatively, may comprise a laminated structure using a plurality of materials. The layer 711 including the luminescent material in the present embodiment has a laminated structure comprising a hole injection layer containing cupper phthalocyanine (Cu-Pc), a hole transport layer containing 4,4'-bis-[N-(naphtyl)-N-phenyl-amino]biphenyl (α-NPD), and a light-emitting layer containing tris-8-quinolinolato aluminum complex ($Alq_3$).

Next, a second electrode 712 is formed on the layer 711 including the luminescent material. It is preferable that the second electrode 712 has a reflectance of 50% or more in a visible light range, and more preferably, a reflective conductive film that has a reflectance of 80% or more is used to form the second electrode 712. Since, the second electrode 712 is an electrode that functions as a cathode, aluminum is used to form the second electrode 712 for a film thickness of 100 nm by evaporation using a metal mask. The material of the second electrode 712 may comprise an alloy such as Mg:Ag, Mg:In, Al:Li, a compound such as $CaF_2$, or CaN, or a conductive film formed by co-evaporation of an element belonging to Group 1 or 2 of the periodic table of the elements and aluminum.

Further, in the case of a structure where light is transmitted also through the second electrode 712, an aluminum film having a thickness from 1 nm to 10 nm or an aluminum film including a slight amount of Li can be used. Before forming an aluminum film from 1 nm to 10 nm, a light-transmitting layer (a film thickness from 1 nm to 5 nm) containing $CaF_2$, $MgF_2$, or $BaF_2$ may be formed as a cathode buffer layer. In this case, a reflector according to the present invention can be provided also over the second electrode 712.

In this way, an active matrix light-emitting device that has a reflector according to the present invention is formed.

Figure 7B:
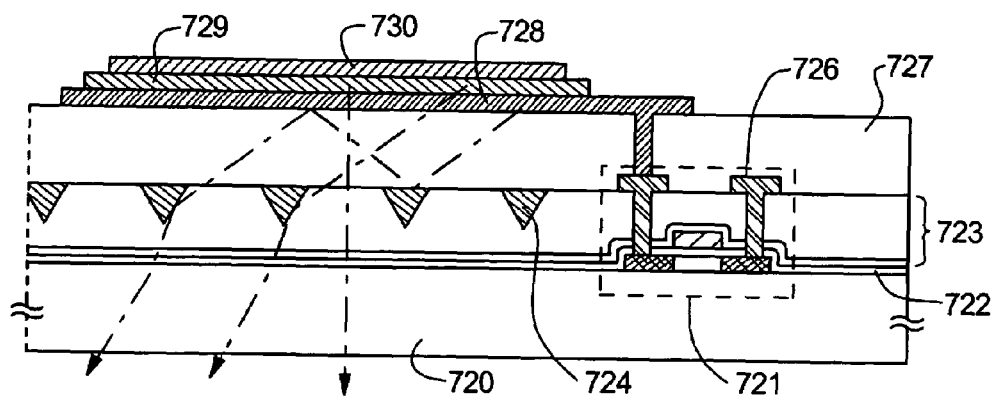

Further, it is also possible that an active matrix light-emitting device in the present invention has a structure shown in FIG. 7B.

In other words, it is also possible to have a structure where a TFT 721 is formed over a substrate 720, a reflector 724 and a wiring 726 are formed after forming a first interlayer insulating film 723 on a gate insulating film 722, and a layer 729 including a luminescent material and a second electrode 730 are laminated in sequence over a first electrode 728 electrically connected to the wiring 726 through a second interlayer insulating film 727 formed over the reflector 724 and the wiring 726.

No further descriptions are needed for the methods and materials for manufacturing the structure shown in FIG. 7B, descriptions are omitted since the structure of FIG. 7B can be formed by using the same materials in the same way as the structure of FIG. 7A.

EMBODIMENT 7

In the present embodiment, a light-emitting device formed according to the present invention, which has a light-emitting element in a pixel portion, will be described with reference to FIGS. 8A and 8B. FIG. 8A is a top view showing the light-emitting device and FIG. 8B is a sectional view of FIG. 8A taken along the line A–A' in FIG. 8A. Reference numeral 801 indicated by a dotted line denotes a driver circuit portion (a source side driver circuit), 802 is a pixel portion, and 803 is a driver circuit portion (a gate side driver circuit). In addition, reference numerals 804 and 805 denote a sealing substrate and a sealing agent, respectively. The inside 807 (see FIG. 8B) surrounded by the sealing agent 805 is a space, and reference numerals 808 and 819 denote a lead wiring and a reflector, respectively.

The lead wiring 808 is provided for transmitting signals to be input to the source side driver circuit 801 and the gate side driver circuit 803, and receives signals such as a video signal, a clock signal, a start signal, and a reset signal, from FPC (Flexible Printed Circuit) 809 that serves as an external input terminal. Though only the FPC is shown in the figure here, a printed wiring board (PWB) may be attached to the FPC. The light-emitting device in the specification includes not only a light-emitting device body but also may have an FPC or a PWB attached thereto.

Next, the sectional structure will be explained with reference to FIG. 8B. The driver circuits and the pixel portion are formed over a device substrate 810. Here, the source side driver circuit 801 as the driver circuit portion and the pixel portion 802 are shown.

In the source side driver circuit 801, a CMOS circuit is formed of a combination of an n-channel TFT 823 and a p-channel TFT 824. The TFTs forming the driver circuit may be formed of a known CMOS circuit, PMOS circuit, or NMOS circuit. Although the present embodiment shows a driver integrated type in which a driver circuit is formed over the substrate, which is not always necessary, the driver circuit can be formed outside the substrate.

The pixel portion 802 includes a plurality of pixels, each including a switching TFT 811, a current controlling TFT 812, and a first electrode 813 connected to the drain of the controlling TFT electrically. In addition, an insulator 814 is formed to cover an edge of the first electrode 813. Here, a positive photosensitive acrylic resin film is used to form the insulator 814.

On the first electrode 813, a layer 816 including a luminescent material and a second electrode 817 are formed. Here, with the first electrode 813 functioning as an anode, it is preferable that the material forming electrode 813 should have a high work function. For example, the electrode 813 may comprise single layers such as an ITO (indium tin oxide) film, an indium zinc oxide (IZO) film, a titanium nitride film, a chromium film, a tungsten film, a Zn film, and a Pt film. It may also comprise structures such as a laminate of a titanium nitride film and a film including aluminum as its main component and a three-layer structure of a titanium nitride film, a film including aluminum as its main component, and a titanium nitride film. When a laminated structure is employed, the wiring has a low resistance, favorable ohmic contact can be made, and it is possible to function as an anode. In the case of the present embodiment, ITO is used to form the first electrode 813.

The layer 816 including the luminescent material is formed by evaporation that uses an evaporation mask or by droplet discharge typified by inkjet. The droplet discharge indicates a method of discharging a droplet including a predetermined composition from a pore to form a specific pattern. The layer 816 including the luminescent material includes layers such as a light-emitting layer, a hole injection layer, a hole transport layer, an electron injection layer, and an electron transport layer. In forming these layers, a low molecular weight material, a middle molecular weight material (including an oligomer and a dendrimer) and a high molecular weight material can be used. In addition, it is often the case that an organic compound is used for a single layer or a laminate in the case of forming the layer including the luminescent material. However, the present invention includes a structure in which an inorganic compound is used for a part of a film containing an organic compound.

In addition, the second electrode (cathode) 817 formed on the layer 816 including the luminescent material functions as a reflective electrode. The second electrode 817 may comprise aluminum (Al).

Further, the sealing substrate 804 and the substrate 810 are bonded with the sealing agent 805 to obtain a structure where a light-emitting element 818 is located in the space 807 surrounded by the substrate 810, the sealing substrate 804, and the sealing agent 805. The space 807 also includes a structure filled with the sealing agent 805 in addition to that filled with inert gas (such as nitrogen or argon).

It is preferable to use epoxy resin for the sealing agent 805. In addition, it is desirable to use a material that permits moisture or oxygen to transmit through thereof as less as possible. Further, as a material that is used for the sealing substrate 804, a plastic substrate containing FRP (Fiberglass-Reinforced Plastics), PVF (polyvinylfluoride), Mylar, polyester, or acrylic can be used besides a glass substrate and a quarts substrate.

In this way, the light-emitting device having a light emitting element can be obtained according to the present invention.

EMBODIMENT 8

In the present embodiment, various electronic devices completed including a light-emitting device, for example, formed according to Embodiment 7 will be described.

As electronic devices manufactured with the use of a light-emitting device according to the present invention, devices such as a video camera, a digital camera, a goggle-type display (head mount display), a navigation system, a sound reproduction device (such as an in-car audio system or an audio set), a computer, a game machine, a personal digital assistant (such as a mobile computer, a cellular phone, a portable game machine, or an electronic book), an image reproduction device equipped with a recording medium (specifically, a device equipped with a display device that can reproduce a recording medium such as a digital versatile disc (DVD) and display the image) can be given. FIGS. 9A to 9G show specific examples of such electronic devices.

Figure 9A:
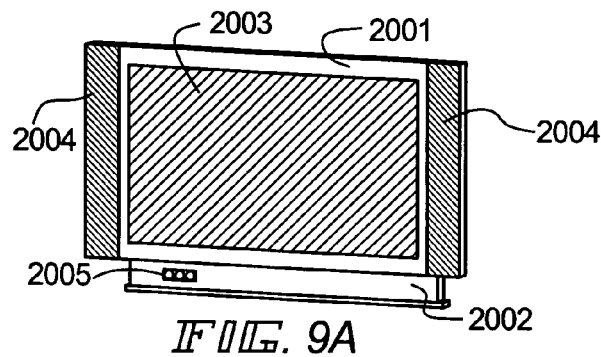
FIGS. 9A to 9G are diagrams illustrating electronic devices.

FIG. 9A is a display device, which includes a frame body 2001, a support 2002, a display portion 2003, a speaker portion 2004, and a video input terminal 2005. A light-emitting device formed according to the present invention is used for the display portion 2003 to manufacture the display device. The display device includes all devices for displaying information such as for a computer, for receiving TV broadcasting, and for displaying an advertisement.

Figure 9B:
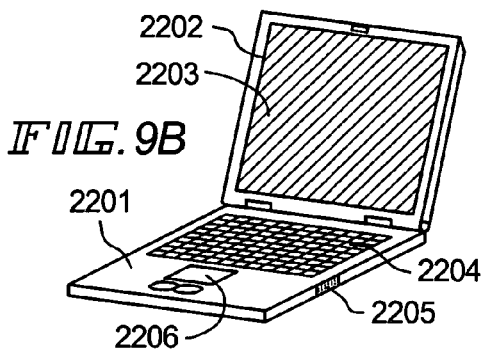

FIG. 9B is a computer, which includes a main body 2201, a frame body 2202, a display portion 2203, a keyboard 2204, an external connection port 2205, and a pointing mouse 2206. A light-emitting device formed according to the present invention is used for the display portion 2203 to manufacture the laptop personal computer.

Figure 9C:
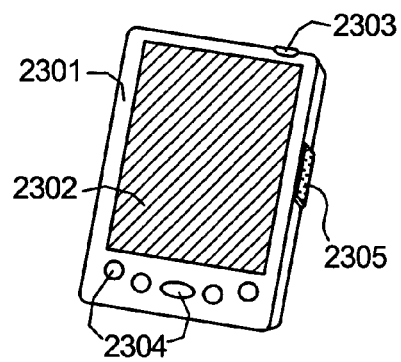

FIG. 9C is a mobile computer, which includes a main body 2301, a display portion 2302, a switch 2303, an operation key 2304, and an infrared port 2305. A light-emitting device formed according to the present invention is used for the display portion 2302 to manufacture the mobile computer.

Figure 9D:
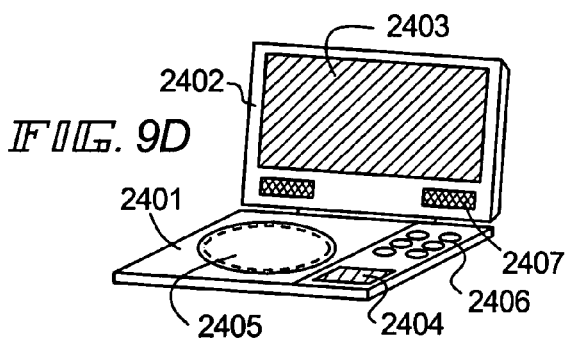

FIG. 9D is a portable image reproduction device equipped with a recording medium (specifically, a DVD reproduction device), which includes a main body 2401, a frame body 2402, a display portion A 2403, a display portion B 2404, a recording medium (such as a DVD) reading portion 2405, an operation key 2406, and a speaker portion 2407. The display portion A 2403 is used mainly for displaying image information while the display portion B 2404 is used mainly for displaying character information, and a light-emitting device formed according to the present invention is used for display portion A 2403 and display portion B 2404 to manufacture the portable image reproduction device equipped with the recording medium. The image reproduction device equipped with the recording medium further includes a home game machine.

Figure 9E:
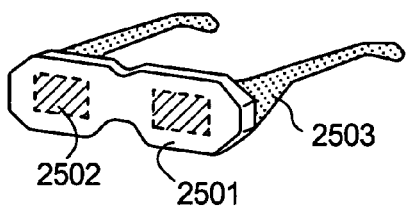

FIG. 9E is a goggle-type display, which includes a main body 2501, a display portion 2502, and an arm portion 2503. A light-emitting device formed according to the present invention is used for the display portion 2502 to manufacture the goggle-type display.

Figure 9F:
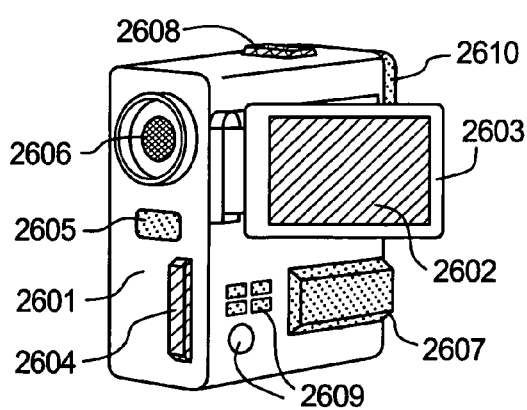

FIG. 9F is a video camera, which includes a main body 2601, a display portion 2602, a frame body 2603, an external connection port 2604, a remote control receiving portion 2605, an image receiving portion 2606, a battery 5607, a sound input portion 2608, an operation key 2609, and an eye piece 2610. A light-emitting device formed according to the present invention is used for the display portion 2602 to manufacture the video camera.

Figure 9G:
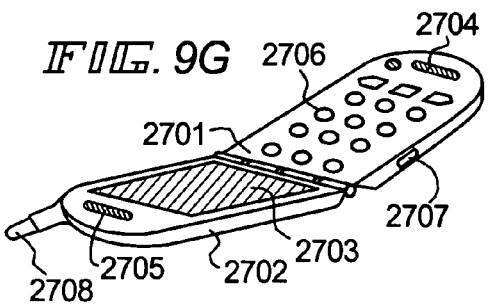

FIG. 9G is a cellular phone, which includes a main body 2701, a frame body 2702, a display portion 2703, a voice input portion 2704, a voice output portion 2705, an operation key 2706, an external connection port 2707, and an antenna 5208. A light-emitting device formed according to the present invention is used for the display portion 2703 to manufacture the cellular phone.

As described above, a light-emitting device formed according to the present invention is quite widely applied. In addition, since the light-emitting device has a light extraction efficiency which is increased by providing a reflector, the light-emitting device permits the driving voltage to be decreased as compared to a light-emitting device formed without providing a reflector. Therefore, it is possible to reduce power consumption and extend a lifetime of electronic devices in all fields by applying this light-emitting device.

Since the arrangement density of a reflector can be increased independently of a light-emitting region by implementing the present invention, it is possible to provide a light-emitting device that has a luminance improved more than ever before.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. A light-emitting device comprising:
a substrate;
a first insulating film over the substrate;
a second insulating film over the first insulating film;
a light-emitting element over the second insulating film, the light-emitting element comprising:
a first transparent electrode;
a layer including a luminescent material; and
a second electrode,
wherein a reflector having an opening is provided between the first insulating film and the second insulating film.

2. The light-emitting device according to claim 1,
wherein the reflector is located in the first insulating film,
wherein the reflector and the first insulating film share a common surface, and
wherein when the layer including the luminescent material has a refractive index $n_1$ and the insulating film has a refractive index $n_2$, the reflector has a slope angle $\phi$:
when $n_1 \geq n_2$, $$\phi = 45 + (1/2)\sin^{-1}(1/n_2) \pm 10(°); \text{ and}$$

when $n_1 < n_2$, $$\phi = 90 - (1/2)\{\sin^{-1}(n_1/n_2) - \sin^{-1}(1/n_2)\} \pm 10(°) \text{ ($n_1$ and $n_2$=1 to 3)}.$$

3. The light-emitting device according to claim 1,
wherein the layer including the luminescent material has a refractive index $n_1$, wherein the reflector has a reflectance $r_1$,
wherein the second electrode has a reflectance $r_2$,
wherein the reflector has an arrangement density x, and
wherein x satisfies the following formula:

$$x\cos < \{\sin^{-1}(1/n_1)\}/[1 - r_1 r_2 [1 - \cos\{\sin^{-1}(1/n_1)\}]]$$
$$(n_1 = 1 \text{ to } 3 \text{ and } 0.5 < r_1, r_2 < 1.0).$$

4. An electronic device comprising the light-emitting device according to claim 1, wherein the electronic device is selected from the group consisting of a display device, a computer, a portable image reproduction device, a goggle type display, a video camera and a cellular phone.

5. The light-emitting device according to claim 1, wherein a shape of the opening of the reflector is hexagonal, quadrangle, or triangular.

6. The light-emitting device according to claim 1, wherein light of the light-emitting element is emitted through the opening of the reflector.

7. The light-emitting device according to claim 1, wherein the first transparent electrode is electrically connected to a thin film transistor.

8. The light-emitting device according to claim 1, wherein the reflector is provided in a position at least partially overlapping the light-emitting element.

9. A light-emitting device comprising:
a substrate;
a first insulating film having a groove over the substrate;
a reflector filling the groove of the first insulating film over the first insulating film;
a second insulating film over the first insulating film and the reflector;
a first electrode over the second insulating film;
a layer including a luminescent material over the first electrode; and
a second electrode over the layer including the luminescent material,
wherein the first insulating film is in contact with the second insulating film.

10. The light-emitting device according to claim 9,
wherein the reflector and the first insulating film share a common surface, and
wherein when the layer including the luminescent material has a refractive index $n_1$ and the first insulating film has a refractive index $n_2$, the reflector has a slope angle $\phi$:
when $n_1 \geq n_2$, $\phi = 45 + (1/2)\sin^{-1}(1/n_2) \pm 10$ (°); and when $n_1 < n_2$, $\phi = 90 - (1/2)\{\sin^{-1}(n_1/n_2) - \sin^{-1}(1/n_2)\} \pm 10$ (°) ($n_1$ and $n_2 = 1$ to 3).

11. The light-emitting device according to claim 9,
wherein the layer including the luminescent material has a refractive index $n_1$, wherein the reflector has a reflectance $r_1$,
wherein the second electrode has a reflectance $r_2$,
wherein the reflector has an arrangement density x, and
wherein x satisfies the following formula:

$x < \cos\{\sin^{-1}(1/n_1)\}/[1 - r_1 r_2[1 - \cos\{\sin^{-1}(1/n_1)\}]]$
($n_1 = 1$ to 3 and $0.5 < r_1, r_2 < 1.0$).

12. An electronic device comprising the light-emitting device according to claim 9, wherein the electronic device is selected from the group consisting of a display device, a computer, a portable image reproduction device, a goggle type display, a video camera and a cellular phone.

13. The light-emitting device according to claim 9, wherein a shape of the opening of the reflector is hexagonal, quadrangle, or triangular.

14. The light-emitting device according to claim 9, wherein light of the light-emitting element is emitted through a position at which the first insulating film is in contact with the second insulating film.

15. The light-emitting device according to claim 9, wherein the first electrode is electrically connected to a thin film transistor.

16. The light-emitting device according to claim 9, wherein the reflector is provided in a position at least partially overlapping the layer including the luminescent material.

* * * * *